(12) United States Patent
Tanaka

(10) Patent No.: US 6,505,334 B1
(45) Date of Patent: Jan. 7, 2003

(54) AUTOMATIC PLACEMENT AND ROUTING METHOD, AUTOMATIC PLACEMENT AND ROUTING APPARATUS, AND SEMICONDUCTOR INTEGRATED CIRCUIT

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 118 days.

(21) Appl. No.: 09/672,790

(22) Filed: Sep. 29, 2000

(30) Foreign Application Priority Data

Apr. 17, 2000 (JP) ........................................ 2000-115580

(51) Int. Cl.[7] .............................................. G06F 17/50
(52) U.S. Cl. ........................................... 716/13; 716/14
(58) Field of Search ........................... 713/13; 716/1–14

(56) References Cited

U.S. PATENT DOCUMENTS 5,889,677 A * 3/1999 Yasuda et al. ................. 716/6
6,226,560 B1 * 5/2001 Hama et al. ................. 700/97
6,260,179 B1 * 7/2001 Ohsawa et al. ............... 716/5
6,327,694 B1 * 12/2001 Kanazawa ..................... 716/7

FOREIGN PATENT DOCUMENTS

JP 5-67178 3/1993
JP 9-213805 8/1997
JP 11-145297 5/1999

* cited by examiner

Primary Examiner—Vuthe Siek
Assistant Examiner—Sun James Lin
(74) Attorney, Agent, or Firm—Burns, Doane, Swecker & Mathis, LLP

(57) ABSTRACT

An automatic placement and routing method checks on a wiring density by scanning a measurement area defined on a routing layout pattern. If the wiring density exceeds an upper limit value, it automatically generates a layout pattern whose wiring density is less than an upper limit value by automatically carrying out one of the following steps: increasing wiring spacing; inserting a wiring inhibited region between wires; replacing a wire by a plurality of divided narrower wires; and forming part of the wiring on a different layer through contact holes. This makes it possible to solve problems of a conventional method in that narrowing a wire whose wiring density exceeds the upper limit value results in reducing reliability cause of an increase of the wire resistance and of the possibility of a break, and in that the design takes a lot of time because the replacement of the wiring requires much manpower.

13 Claims, 8 Drawing Sheets

AUTOMATIC PLACEMENT AND ROUTING METHOD, AUTOMATIC PLACEMENT AND ROUTING APPARATUS, AND SEMICONDUCTOR INTEGRATED CIRCUIT

BACKGROUND OF THE INVENTION

1. Field of the Invention

The present invention relates to an automatic placement and routing method and an automatic placement and routing apparatus, which are used in designing a semiconductor integrated circuit for automatically correcting the routing layout pattern such that the wiring density becomes less than an upper limit value, and to a semiconductor integrated circuit produced by applying the automatic placement and routing method.

2. Description of Related Art

In a conventional design technique of a semiconductor integrated circuit, there is no automatic placement and routing method of automatically generating the entire layout pattern of the semiconductor integrated circuit with maintaining the wiring density at less than the upper limit value. Here, the term "wiring density" refers to a ratio of a wiring area captured by scanning a certain measurement area to the measurement area, the wiring area being obtained by summing up wiring width×wiring length of each of all wires in the measurement area. The measurement area to be scanned can be a 300 μm×300 μm region, for example. Accordingly, the wiring density is expressed as the total wiring area in the measurement area÷the measurement area, where the total wiring area=Σ(width×length of each wire).

Since the wiring method of the conventional semiconductor integrated circuit is carried out as described above, if the wiring density exceeds the upper limit value in the design of the semiconductor integrated circuit, the wiring widths or placement must be corrected manually to narrow the wiring widths. This will require much manpower, presenting a problem of increasing design time and cost. In addition, the semiconductor integrated circuit with a wiring density beyond the upper limit value has problems in that it is likely to have higher wire resistance, to suffer from a break, and to reduce reliability.

SUMMARY OF THE INVENTION

The present invention is implemented to solve the foregoing problems. It is therefore an object of the present invention to provide an automatic placement and routing method, an automatic placement and routing apparatus for a semiconductor integrated circuit capable of automatically controlling the wiring density in the routing design of the semiconductor integrated circuit by automatically checking the wiring density, and by correcting the routing layout pattern when the wiring density exceeds an upper limit value so that the wiring density becomes less than the upper limit value, thereby improving the efficiency of designing the routing layout pattern.

According to a first aspect of the present invention, there is provided an automatic placement and routing method of automatically controlling the wiring density, the automatic placement and routing method comprising the steps of: generating a routing layout pattern from gate level circuit information about a semiconductor integrated circuit by using an automatic placement and routing tool; scanning a predetermined measurement area in the routing layout pattern; checking whether a wiring density in the measurement area is less than a predetermined upper limit value or not as a result of the scanning; and correcting, if the wiring density exceeds the upper limit value, the routing layout pattern such that the wiring density becomes less than the upper limit value.

Here, the automatic placement and routing method may further comprise the step of generating a routing layout pattern with a wiring density less than the upper limit value.

The routing layout pattern may be a global routing layout pattern, and the automatic placement and routing method may further comprise the step of generating a detail routing layout pattern of the semiconductor integrated circuit from the corrected global routing layout pattern.

When it is found that the wiring density in a same layer exceeds the upper limit value as a result of the step of checking, the step of correcting the routing layout pattern may carry out the correction by extending wiring spacing to make the wiring density less than the upper limit value, the extension of the wiring spacing can be made by one of extending the wiring spacing at a predetermined value, extending the wiring spacing at a predetermined ratio, and extending the wiring spacing by a minimum value that makes the wiring density less than the upper limit value.

When it is found that the wiring density in a same layer exceeds the upper limit value as a result of the step of checking, the step of correcting the routing layout pattern may carry out the correction by inserting a wiring inhibited region of a predetermined width between wires to make the wiring density less than the upper limit value.

When it is found that the wiring density in a same layer exceeds the upper limit value as a result of the step of checking, the step of correcting the routing layout pattern may carry out the correction by forming part of the wiring on a different layer through contact holes to make the wiring density less than the upper limit value.

When it is found that the wiring density in a same layer exceeds the upper limit value as a result of the step of checking, and that the wiring density cannot be reduced by shifting a wide wire with a width greater than a predetermined value, the step of correcting the routing layout pattern may carry out the correction by dividing the wide wire into a plurality of narrower wires and by replacing the wide wire by the narrower wires to make the wiring density less than the upper limit value.

When it is found that the wiring density of wires formed on a same layer exceeds the upper limit value, and hence the wide wire is to be replaced by the plurality of narrow wires, the step of correcting the routing layout pattern may carry out the correction by making the width from one side to the other side of the plurality of narrow wires equal to or less than the width of the wide wire.

When it is found that the wiring density of wires formed on a same layer exceeds the upper limit value, and hence the wide wire is to be replaced by the plurality of narrow wires, the step of correcting the routing layout pattern may carry out the correction by making a sum total of widths of the plurality of narrow wires equal to the width of the wide wire.

According to a second aspect of the present invention, there is provided a semiconductor integrated circuit produced by applying the automatic placement and routing method of the first aspect.

According to a third aspect of the present invention, there is provided an automatic placement and routing apparatus for automatically controlling a wiring density, the automatic placement and routing apparatus comprising: means for generating a routing layout pattern by retrieving gate level circuit information about a semiconductor integrated circuit stored in a memory and by using an automatic placement and routing tool; means for scanning a predetermined measurement area in the routing layout pattern; means for checking whether a wiring density in the measurement area is less than a predetermined upper limit value or not as a result of the scanning; means for correcting, if the wiring density exceeds the upper limit value, the routing layout pattern such that the wiring density becomes less than the upper limit value by dividing a wire into a wiring set consisting of a plurality of wires; and means for generating the routing layout pattern with the wiring density less than the upper limit value.

Here, the means for correcting the routing layout pattern may divide the wire such that a width of the wiring set from one side to the other side is equal to or less than a width of the wire before division.

The means for correcting the routing layout pattern may divide the wire such that a sum total of widths of individual wires of the wiring set after the division is equal to the width of the wire before the division.

DETAILED DESCRIPTION OF THE PREFERRED EMBODIMENTS

The invention will now be described with reference to the accompanying drawings.

Embodiment 1

In the following description, the term "wiring density" refers to a value obtained by dividing a wiring area by a measurement area, the wiring area being a value obtained by summing up width×length of each of all the wires up to the total number of the wires formed on the semiconductor integrated circuit. Accordingly, the wiring density is expressed as the total wiring area in the measurement area÷the measurement area, where the total wiring area=Σ (width÷length of each wire)

Figure 1:
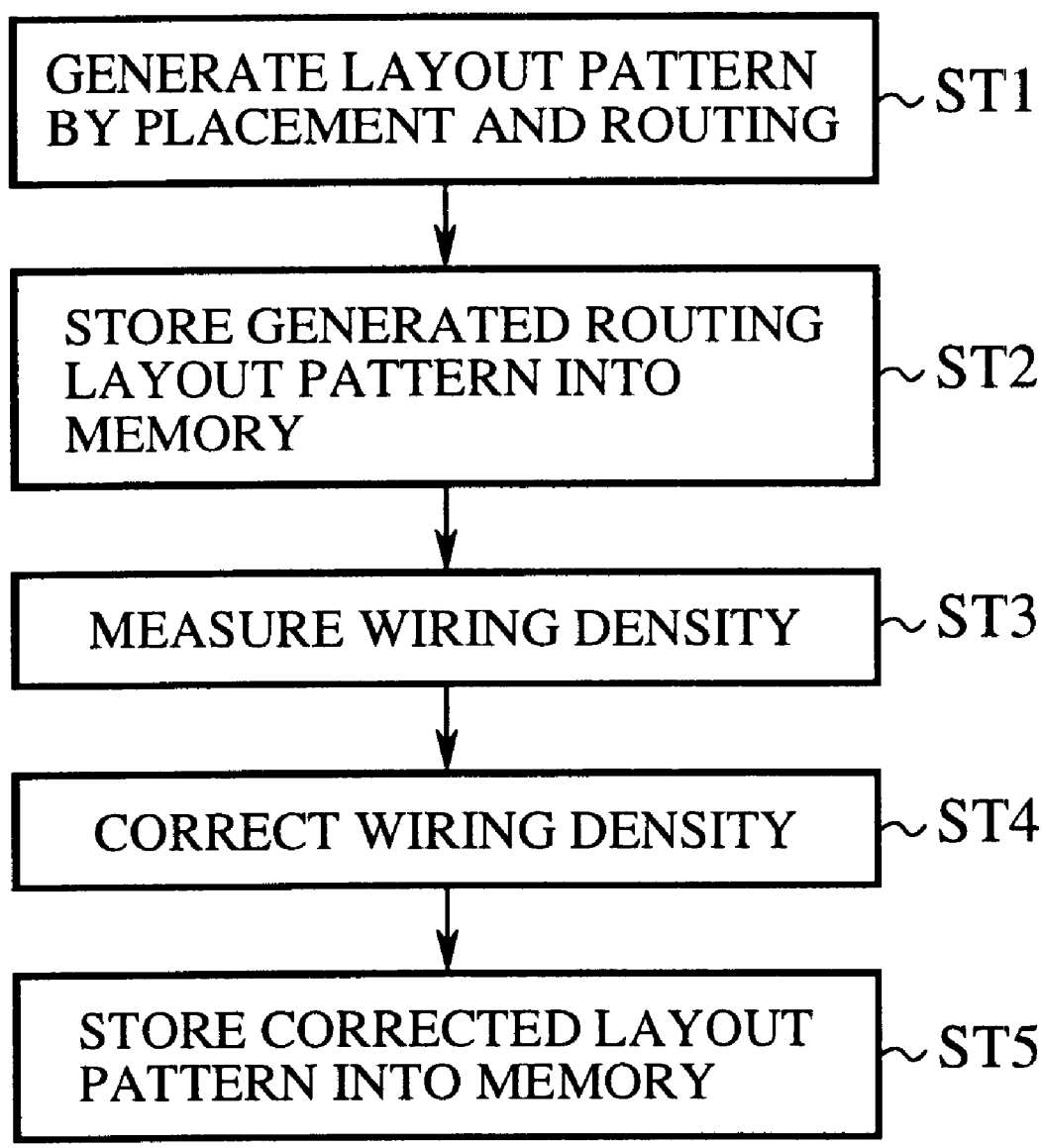
FIG. 1 is a flowchart illustrating the operation of an automatic placement and routing method in embodiments 1–6 in accordance with the present invention.
Figure 2:
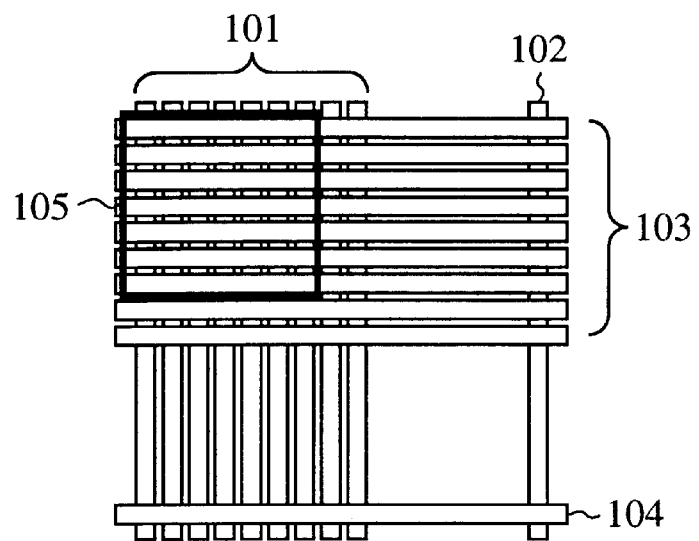
FIG. 2 is a diagram illustrating a routing layout pattern before applying the automatic placement and routing method of the embodiment 1.

FIG. 1 is a flowchart illustrating the operation of an automatic placement and routing method in embodiments 1–6 in accordance with the present invention; and FIG. 2 is a diagram illustrating a routing layout pattern before applying the automatic placement and routing method of the embodiment 1, that is, illustrating a pattern when no wiring density constraint is imposed. In FIG. 2, the reference numeral 101 designates a wiring set with a high wiring density formed on the same layer. The reference numeral 102 designates a wire placed at a location separated apart from the wiring set 101 but formed on the same layer as the individual wires in the wiring set 101. The reference numeral 103 designates a wiring set formed on a layer different from the layer of the wiring set 101 and the wire 102. The reference numeral 104 designates a wire formed on the same layer as the wiring set 103, but is placed at a location separated apart from the wiring set 103.

The reference numeral 105 designates a measurement area for measuring the wiring density. The measurement area is properly determined in a design process step of the semiconductor integrated circuit such as 100 μm×100 μm, for example. Although the measurement area 105 is not necessarily based on the area of the semiconductor integrated circuit, it can be determined relatively to the total area of the semiconductor integrated circuit, such as an area of 1/1000 thereof. The measurement area is assumed to be determined in the same manner in the following embodiments 2–7.

Figure 3:
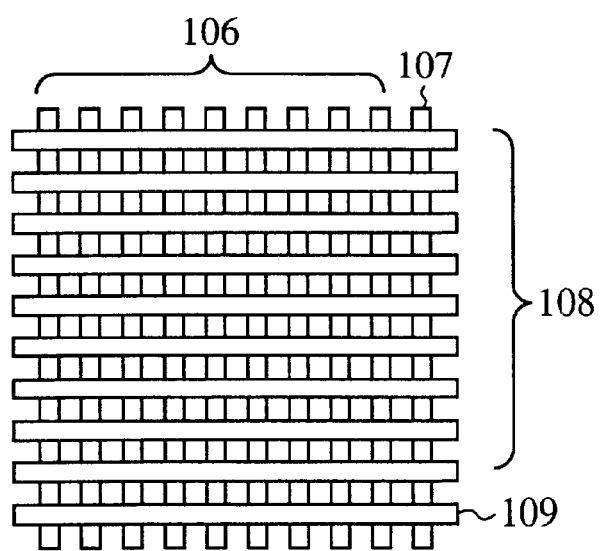
FIG. 3 is a diagram illustrating a corrected routing layout pattern after applying the automatic placement and routing method of the embodiment 1.

FIG. 3 is a diagram illustrating a corrected routing layout pattern after applying the automatic placement and routing method of the present embodiment 1 to the routing layout pattern as illustrated in FIG. 2, thereby imposing the wiring density constraint. In FIG. 3, the reference numeral 106 designates a co-layer wiring set obtained by extending wiring spacing of the wiring set 101 such that the wiring density becomes less than the upper limit value. The reference numeral 107 designates a wire corresponding to the wire 102 in FIG. 2. The reference numeral 108 designates a wiring set obtained by extending wiring spacing of the wiring set 103 such that the wiring density becomes less than the upper limit value. The reference numeral 109 designates a wire corresponding to the wire 104 in FIG. 2.

Next, the operation of the present embodiment 1 will be described.

In the automatic placement and routing method in the embodiment 1, gate level circuit information is captured which is produced in accordance with the specification of the function and structure of the semiconductor integrated circuit described in hardware description language HDL, first, and then a routing layout pattern is generated using an automatic placement and routing tool (step ST1).

Subsequently, the routing layout pattern obtained is stored in a memory (step ST2). FIG. 2 illustrates the layout pattern thus obtained. Subsequently, the wiring density of the routing layout pattern of FIG. 2 is measured. In the wiring density measurement, a measurement area is scanned to check whether the wiring density exceeds an upper limit value or not. Then, a similar check is made with shifting the measurement area 105 on the semiconductor integrated circuit. Generally, the measurement area 105 consists of a 300 μm×300 μm area, and tens of thousands of such measurement areas on the semiconductor integrated circuit are used (step ST3).

When detection is made as a result of the scanning of the measurement area 105 in the routing layout pattern that the wiring density exceeds the upper limit value, the wiring spacing in the wiring set 101 and wiring spacing in the wiring set 103 in the different layer are extended such that each wiring density becomes less than the upper limit value. The extended amount is determined such that it takes a predetermined value or predetermined ratio, or that the wiring spacing takes a minimum value within the upper limit value of the wiring density, thereby correcting the routing layout pattern (step ST4).

As a result, a corrected routing layout pattern is obtained as shown in FIG. 3, and is stored in the memory not shown (step ST5). The wiring spacing in the wiring set 101 of FIG. 2 is extended as shown in the wiring set 106 of FIG. 3. Likewise, the wiring spacing in the wiring set 103 of FIG. 2 is extended as shown in the wiring set 108 of FIG. 3. The wire 107 corresponds to the wire 102, and the wire 109 corresponds to the wire 104. Although the wire 102 or 104 can be shifted accompanying the extension of the wiring spacing of the wiring set 101 or 103, they maintain their original positions as the wires 107 and 109 in the routing layout pattern of FIG. 3.

As described above, the present embodiment 1 is configured such that it scans the measurement areas in the routing layout pattern obtained from the gate level circuit information about the semiconductor integrated circuit; checks whether the wiring density of each layer is less than the upper limit value of the wiring density; and extends the wiring spacing, when the wiring density exceeds the upper limit value, in such a manner that the wiring spacing is extended by the predetermined value or by the predetermined ratio, or that the wiring density provides the minimum wiring spacing within the upper limit value. This makes it possible to automatically correct the routing layout pattern such that the wiring density becomes less than the upper limit value, and to improve the efficiency of the routing design. Furthermore, the reliability of the semiconductor integrated circuit obtained by the automatic placement and routing method is improved.

Embodiment 2

Figure 4:
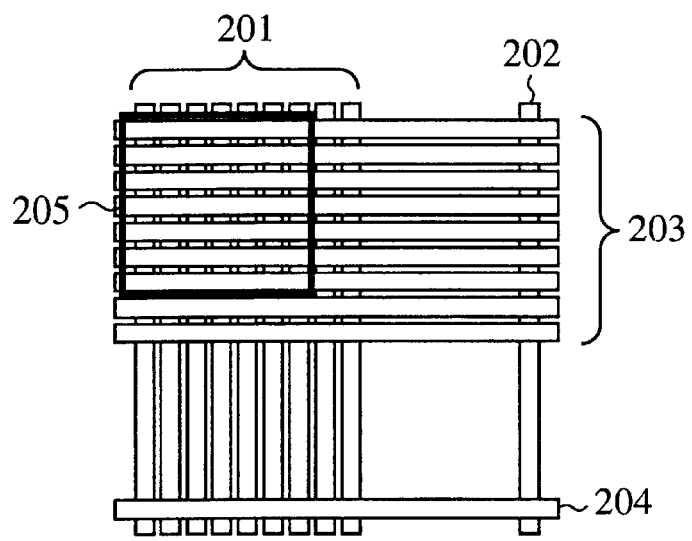
FIG. 4 is a diagram illustrating a routing layout pattern before applying the automatic placement and routing method of the embodiment 2.

The operation of the automatic placement and routing method of the present embodiment 2 is the same as that illustrated in the flowchart of FIG. 1. FIG. 4 illustrates a routing layout pattern before applying the automatic placement and routing method of the present embodiment 2, that is, before imposing the wiring density constraint. In FIG. 4, the reference numeral 201 designates a wiring set with a high wiring density formed on the same layer. The reference numeral 202 designates a wire placed at a location separated apart from the wiring set 201, but formed on the same layer as the individual wires in the wiring set 201. The reference numeral 203 designates a wiring set formed on a layer different from the layer of the wiring set 201 and the wire 202. The reference numeral 204 designates a wire formed on the same layer as the wiring set 203, but placed at a location separated apart from the wiring set 203. The reference numeral 205 designates a measurement area for measuring the wiring density.

Figure 5:
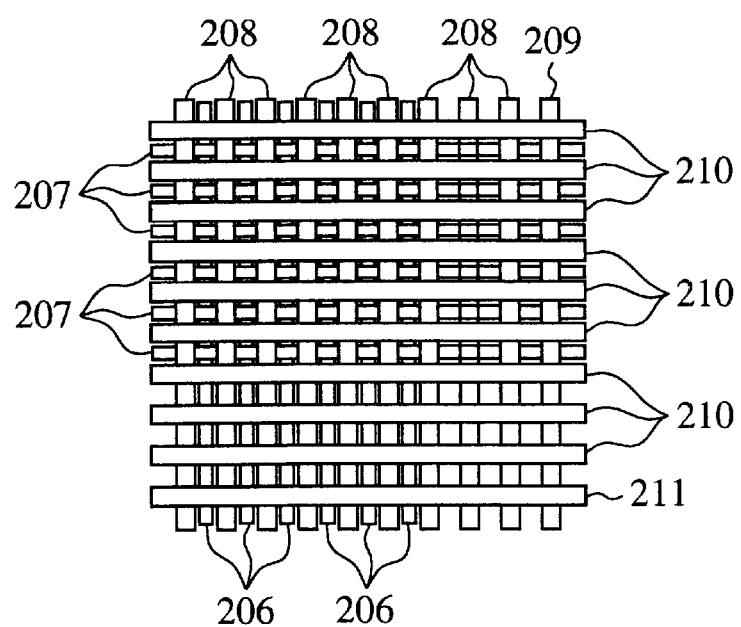
FIG. 5 is a diagram illustrating a corrected routing layout pattern after applying the automatic placement and routing method of the embodiment 2.

FIG. 5 is a diagram illustrating a corrected routing layout pattern after applying the automatic placement and routing method of the present embodiment 2 to the routing layout pattern in FIG. 4, with imposing the wiring density constraint. In FIG. 5, the reference numeral 208 designates a co-layer wiring set obtained by extending wiring spacing of the wiring set 201 such that the wiring density becomes less than the upper limit value. Between the wires of the wiring set 208, wiring inhibited regions 206 are formed. The reference numeral 210 designates a wiring set obtained by extending wiring spacing of the wiring set 203 such that the wiring density becomes less than the upper limit value. Between the wires of the wiring set 210, wiring inhibited regions 207 are formed. The reference numeral 209 designates a wire corresponding to the wire 202 in FIG. 4, and the reference numeral 211 designates a wire corresponding to the wire 204 in FIG. 4.

Next, the operation of the present embodiment 2 will be described.

The operation of the present embodiment 2 is the same as that of the foregoing embodiment 1 from step ST1 to ST3 in the flowchart as illustrated in FIG. 1. Subsequently, when it is found that the wiring density exceeds the upper limit value as a result of the scanning of the measurement area 205 at step ST3, the wiring inhibited regions 206 and 207 are provided between the wires in the wiring sets 201 and 203 such that the wiring density becomes less than the upper limit value. After inserting the wiring inhibited regions 206 and 207, correction of the wiring routes is carried out. As a result, the routing layout pattern as shown in FIG. 5 is obtained. The routing layout pattern is corrected such that the wiring inhibited regions 206 are provided between the wires in the wiring set 208, and the wiring inhibited regions 207 are provided between the wires in the wiring set 210 formed on a layer different from the layer of the wiring set 208 (step ST4).

Although the wire 202 or 204 can be shifted accompanying the extension of the wiring spacing of the wiring set 201 or 203, they maintain their original positions as the wires 209 and 211 in the routing layout pattern of FIG. 5.

As described above, the present embodiment 2 is configured such that it is supplied with the gate level circuit information about the semiconductor integrated circuit; scans the measurement areas on the routing layout pattern obtained using an automatic placement and routing tool; checks whether the wiring density of each layer is less than the upper limit value of the wiring density; and inserts the wiring inhibited regions between the wires when the wiring density exceeds the upper limit value so that the wiring density becomes less than the upper limit value. This makes it possible to automatically correct the routing layout pattern such that the wiring density becomes less than the upper limit value, and to improve the efficiency of the routing design. Furthermore, the reliability of the semiconductor integrated circuit obtained by the automatic placement and routing method is improved.

Embodiment 3

Figure 6:
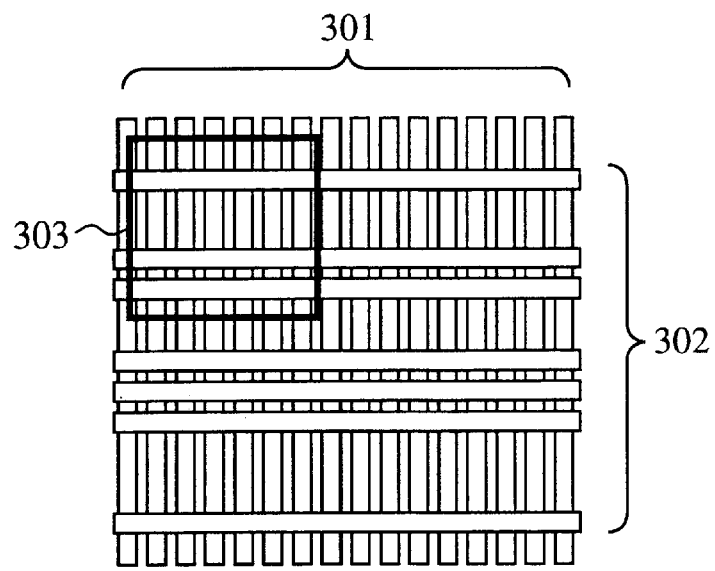
FIG. 6 is a diagram illustrating a routing layout pattern before applying the automatic placement and routing method of the embodiment 3.

The operation of the automatic placement and routing method of the present embodiment 3 is the same as that illustrated in the flowchart of FIG. 1. FIG. 6 illustrates a routing layout pattern before applying the automatic placement and routing method of the present embodiment 3, that is, before imposing the wiring density constraint. In FIG. 6, the reference numeral 301 designates a co-layer wiring set with a high wiring density. The reference numeral 302 designates a wiring set formed on a layer different from the layer of the wiring set 301. The wiring density of the wiring set 302 does not exceed the upper limit value. The reference numeral 303 designates a measurement area for measuring the wiring density.

Figure 7:
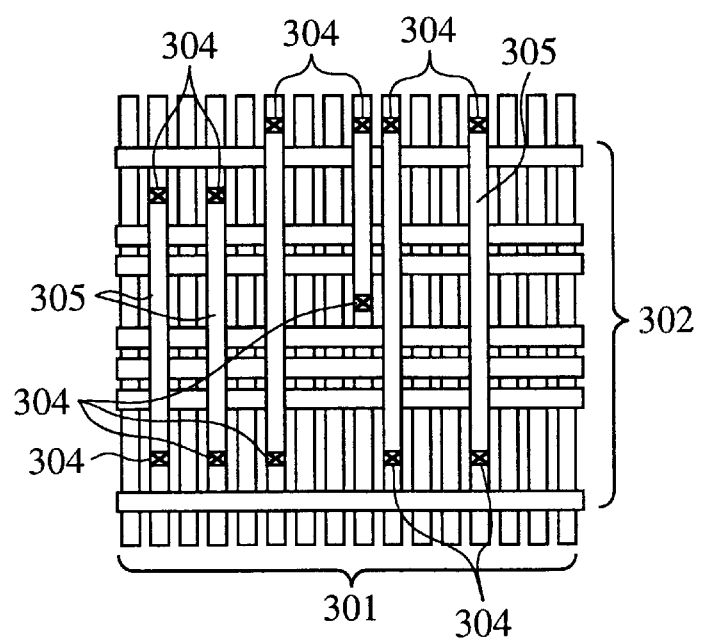
FIG. 7 is a diagram illustrating a corrected routing layout pattern after applying the automatic placement and routing method of the embodiment 3.

FIG. 7 is a diagram illustrating a corrected routing layout pattern after applying the automatic placement and routing method of the present embodiment 3 to the routing layout pattern as illustrated in FIG. 6, with imposing the wiring density constraint. In FIG. 7, each reference numeral 304 designates a contact hole provided in a wire in the wiring set 301 to connect the wire to a wire 305 formed on a layer different from the layer of the wiring set 301.

Next, the operation of the present embodiment 3 will be described.

The operation of the present embodiment 3 is the same as that of the foregoing embodiment 1 from step ST1 to ST3 in the flowchart in FIG. 1. Subsequently, when it is found that the wiring density exceeds the upper limit value as a result of the scanning of the measurement area 303 at step ST3, the contact holes 304 are formed in some portions of the wires in the wiring set 301, and the wires 305 are formed on the layer different from the layer on which the wires in the wiring set 301 is formed (step ST4). Since the wiring set 302 has the wiring density less than the upper limit value, it remains unchanged.

As described above, the present embodiment 3 is configured such that it is supplied with the gate level circuit information about the semiconductor integrated circuit; scans the measurement areas on the routing layout pattern obtained using an automatic placement and routing tool; checks whether the wiring density of each layer is less than the upper limit value of the wiring density; and forms part of the wiring set on a different layer and connects the wires on the two layers through the contact holes when the wiring density exceeds the upper limit value so that the wiring density becomes less than the upper limit value. This makes it possible to automatically correct the routing layout pattern such that the wiring density becomes less than the upper limit value, and to improve the efficiency of the routing design. Furthermore, the reliability of the semiconductor integrated circuit obtained by the automatic placement and routing method is improved.

Embodiment 4

Figure 8:
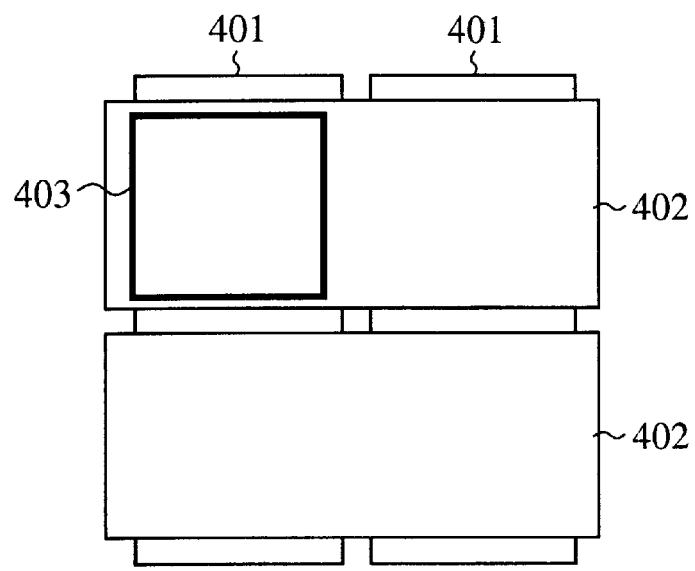
FIG. 8 is a diagram illustrating a routing layout pattern before applying the automatic placement and routing method of the embodiment 4.

The operation of the automatic placement and routing method of the present embodiment 4 is the same as that illustrated in the flowchart of FIG. 1. FIG. 8 illustrates a routing layout pattern before applying the automatic placement and routing method of the present embodiment 4, that is, before imposing the wiring density constraint. In FIG. 8, reference numerals 401 each designate a co-layer wire with a high wiring density and a wide width. Likewise, reference numerals 402 each designate a co-layer wire with a high wiring density and a wide width. The reference numeral 403 designates a measurement area for measuring the wiring density.

Figure 9:
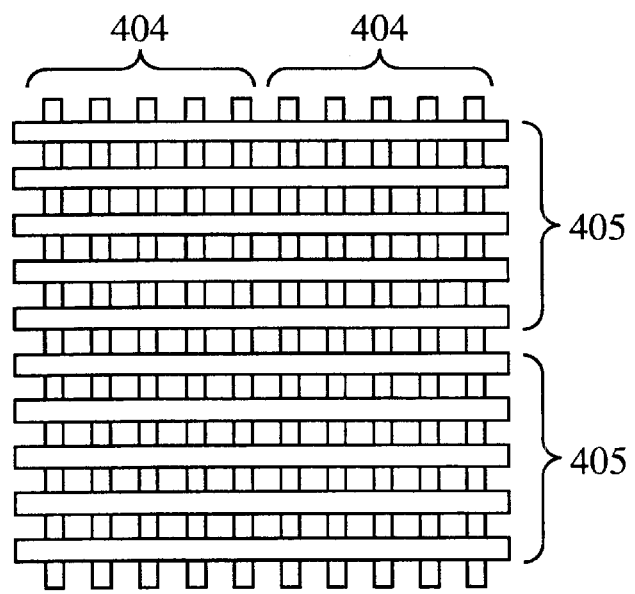
FIG. 9 is a diagram illustrating a corrected routing layout pattern after applying the automatic placement and routing method of the embodiment 4.

FIG. 9 is a diagram illustrating a corrected routing layout pattern after applying the automatic placement and routing method of the present embodiment 4 to the routing layout pattern as illustrated in FIG. 8, with imposing the wiring density constraint. In FIG. 9, reference numerals 404 each designate a co-layer wiring set obtained by dividing the wide wire 401 into a plurality of narrow wires such that the wiring density becomes less than the upper limit value. Likewise, reference numerals 405 each designate a co-layer wiring set obtained by dividing the wide wire 402 into a plurality of narrow wires such that the wiring density becomes less than the upper limit value.

Next, the operation of the present embodiment 4 will be described.

The operation of the present embodiment 4 is the same as that of the foregoing embodiment 1 from step ST1 to ST3 in the flowchart of FIG. 1. Subsequently, when it is found that the wiring density exceeds the upper limit value as a result of the scanning of the measurement area 403 at step ST3, the correction is made such that the wide wire 401 is replaced by the co-layer wiring set 404 obtained by dividing the wide wire 401 into the plurality of narrow wires, and that the wide wire 402 is replaced by the co-layer wiring set 405 obtained by dividing the wide wire 402 into the plurality of narrow wires.

As described above, the present embodiment 4 is configured such that it is supplied with the gate level circuit information about the semiconductor integrated circuit; scans the measurement areas defined on the routing layout pattern produced by an automatic placement and routing tool; checks whether the wiring density of each wiring is less than the upper limit value of the wiring density; and replaces each of the wide wires by the plurality of narrow wires formed by dividing the wide wire when the wiring density exceeds the upper limit value so that the wiring density becomes less than the upper limit value. This makes it possible to automatically correct the routing layout pattern such that the wiring density becomes less than the upper limit value, and to improve the efficiency of the routing design. Furthermore, the reliability of the semiconductor integrated circuit obtained by the automatic placement and routing method is improved.

Embodiment 5

Figure 10:
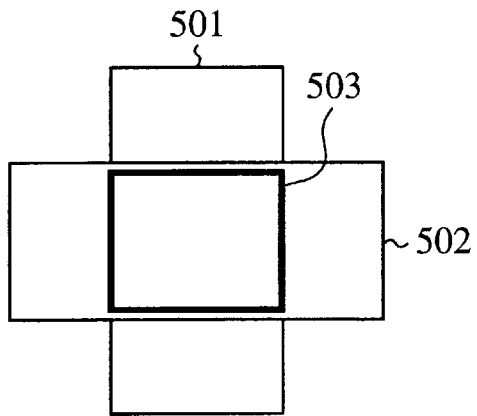
FIG. 10 is a diagram illustrating a routing layout pattern before applying the automatic placement and routing method of the embodiment 5.

The operation of the automatic placement and routing method of the present embodiment 5 is the same as that illustrated in the flowchart of FIG. 1. FIG. 10 illustrates a routing layout pattern before applying the automatic placement and routing method of the present embodiment 5, that is, before imposing the wiring density constraint. In FIG. 10, the reference numeral 501 designates a wire with a high wiring density and a wide width. Likewise, the reference numeral 502 designates a wire with a high wiring density and a wide width. The reference numeral 503 designates a measurement area for measuring the wiring density.

Figure 11:
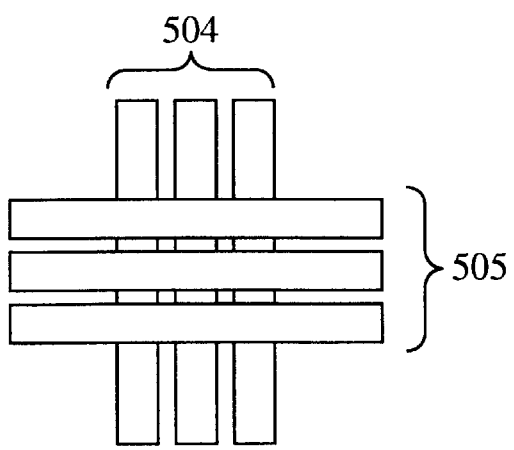
FIG. 11 is a diagram illustrating a corrected routing layout pattern after applying the automatic placement and routing method of the embodiment 5.

FIG. 11 is a diagram illustrating a corrected routing layout pattern after applying the automatic placement and routing method of the present embodiment 5 to the routing layout pattern of FIG. 10, with imposing the wiring density constraint. In FIG. 11, the reference numeral 504 designates a co-layer wiring set obtained by dividing the wide wire 501 into a plurality of narrow wires such that the wiring density becomes less than the upper limit value. Likewise, the reference numeral 505 designates a co-layer wiring set obtained by dividing the wide wire 502 into a plurality of narrow wires such that the wiring density becomes less than the upper limit value.

Next, the operation of the present embodiment 5 will be described.

The operation of the present embodiment 5 is the same as that of the foregoing embodiment 1 from step ST1 to ST3 in the flowchart of FIG. 1. Subsequently, when it is found that the wiring density exceeds the upper limit value as a result of the scanning of the measurement area 503 at step ST3, the correction is made such that the wide wire 501 is replaced by the co-layer wiring set 504 obtained by dividing the wide wire 501 into the plurality of narrow wires, and that the wide wire 502 is replaced by the co-layer wiring set 505 obtained by dividing the wide wire 502 into the plurality of narrow wires (step ST4).

Figure 12:
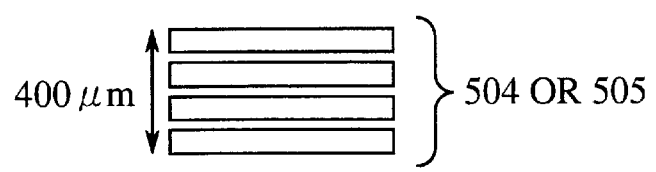
FIG. 12 is a diagram illustrating a constraint imposed on the automatic placement and routing method of the embodiment 5.

In the present embodiment 5, as illustrated in FIG. 12, the distance from one side to the other side of the wiring set 504 or 505 (400 μm wide in FIG. 12) is made equal or less than the width of the wire 501 or 502 before the division. In other words, the width of the wired region is determined such that the wiring density becomes less than the upper limit value. This makes it possible to obviate the need for moving and replacing the remaining wiring, having little effect on the remaining wiring when replacing the wide wires 501 and 502 by the wiring sets 504 and 505 consisting of the divided wires.

An automatic placement and routing apparatus for automatically generating a routing layout pattern with designating the wiring width in such a manner that the wiring density becomes less than the upper limit value can be implemented as a computer system comprising the following functions: The computer system can comprise, for example, means for generating the routing layout pattern using an automatic placement and routing tool by retrieving the gate level circuit information about the semiconductor integrated circuit, which information is stored in a memory; means for scanning a predetermined measurement area in the routing layout pattern; means for correcting the routing layout pattern such that the wiring density becomes less than an upper limit value by checking whether the wiring density in the measurement area exceeds the upper limit value as a result of the scanning, by designating a wiring region when the wiring density exceeds the upper limit value (in the example as shown in FIG. 12, the wiring region is designated such that the width from one side to the other side of each of the divided wiring sets 504 and 505 becomes less than 400 μm), by dividing the wires such that the width from one side to the other side of each of the divided wiring sets becomes less than the width of the wires before the division, and by placing the divided wiring sets in the wiring region; and means for generating the routing layout pattern with the wiring density less than the upper limit value.

As described above, the present embodiment 5 is configured such that it is supplied with the gate level circuit information about the semiconductor integrated circuit; scans the measurement areas on the routing layout pattern produced by an automatic placement and routing tool; checks whether the wiring density of each wiring set is less than the upper limit value of the wiring density; and replaces each wide wire by the plurality of narrow wires formed by dividing the wide wire when the wiring density exceeds the upper limit value so that the wiring density becomes less than the upper limit value, particularly so that the side-to-side width of each wiring set becomes equal to or less than each wire before the division. This makes it possible to automatically correct the routing layout pattern such that the wiring density becomes less than the upper limit value. This also makes it possible to improve the efficiency of the routing design, with adding little effect to the remaining wiring satisfying the wiring density. Furthermore, the reliability is improved of the semiconductor integrated circuit obtained by the automatic placement and routing method or by the automatic placement and routing apparatus.

Embodiment 6

Figure 13:
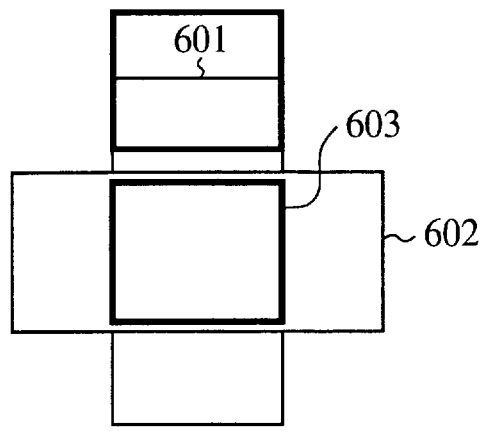
FIG. 13 is a diagram illustrating a routing layout pattern before applying the automatic placement and routing method of the embodiment 6.

The operation of the automatic placement and routing method of the present embodiment 6 is the same as that illustrated in the flowchart of FIG. 1. FIG. 13 illustrates a routing layout pattern before applying the automatic placement and routing method of the present embodiment 6, that is, before imposing the wiring density constraint. In FIG. 13, the reference numeral 601 designates a wire with a high wiring density and a wide width. Likewise, the reference numeral 602 designates a wire with a high wiring density and a wide width, which is provided on a layer different from the layer on which the wire 601 is formed. The reference numeral 603 designates a measurement area for measuring the wiring density.

Figure 14:
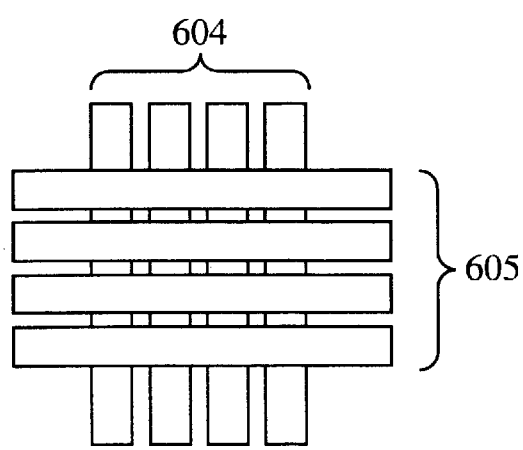
FIG. 14 is a diagram illustrating a corrected routing layout pattern after applying the automatic placement and routing method of the embodiment 6.

FIG. 14 is a diagram illustrating a corrected routing layout pattern after applying the automatic placement and routing method of the present embodiment 6 to the routing layout pattern as illustrated in FIG. 13, with imposing the wiring density constraint. In FIG. 14, the reference numeral 604 designates a co-layer wiring set obtained by dividing the wide wire 601 into a plurality of narrow wires such that the wiring density becomes less than the upper limit value. Likewise, the reference numeral 605 designates a co-layer wiring set obtained by dividing the wide wire 602 into a plurality of narrow wires such that the wiring density becomes less than the upper limit value.

Next, the operation of the present embodiment 6 will be described.

The operation of the present embodiment 6 is the same as that of the foregoing embodiment 1 from step ST1 to ST3 in the flowchart of FIG. 1. Subsequently, when it is found that the wiring density exceeds the upper limit value as a result of the scanning of the measurement area 603 at step ST3, the correction is made such that the wide wire 601 is replaced by the co-layer wiring set 604 obtained by dividing the wide wire 601 into the plurality of narrow wires, and that the wide wire 602 is replaced by the co-layer wiring set 605 obtained by dividing the wide wire 402 into the plurality of narrow wires (step ST4).

Figure 15:
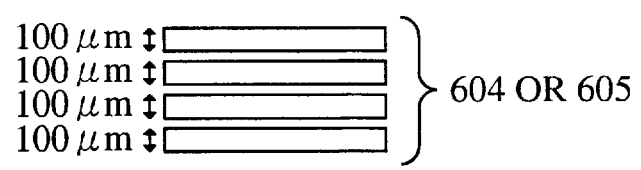
FIG. 15 is a diagram illustrating a constraint imposed on the automatic placement and routing method of the embodiment 6.

In the present embodiment 6, as shown in FIG. 15, the sum total of the widths of the wires in each of the wiring sets 604 and 605 after the division becomes equal to the width of each of the wires 601 and 602 before the division (step ST4). Thus, the current amounts flowing through the corrected wiring sets are the same as those flowing through the wires before the correction. This makes the consumption power control easier in the semiconductor integrated circuit design.

Furthermore, by designating the occupying width of the wiring set when designing the routing layout pattern to be stored in the memory at step ST2, the wires can be divided such that the wiring width does not exceed the occupying width. For example, when the width of the wiring sets 604 and 605 is set 400 μm, the widths of individual divided wires in the wiring set are corrected such that their sum total becomes 400 μm.

An automatic placement and routing apparatus for automatically generating the routing layout pattern satisfying the prescribed wiring density can be implemented as a computer system comprising the following functions: The computer system can comprise, for example, means for generating the routing layout pattern using an automatic placement and routing tool by retrieving the gate level circuit information about the semiconductor integrated circuit, which information is stored in a memory; means for scanning a predetermined measurement area in the routing layout pattern; means for correcting the routing layout pattern such that the wiring density becomes less than an upper limit value by checking whether the wiring density in the measurement area exceeds the upper limit value as a result of the scanning, by designating a wiring region and dividing the wires when the wiring density exceeds the upper limit value (in the example as shown in FIG. 15, the wire is divided such that the sum total of the widths of the wires after the division equals the width of the wire before the division, that is, 400 μm); and means for generating the routing layout pattern with the wiring density less than the upper limit value.

As described above, the present embodiment 6 is configured such that it is supplied with the gate level circuit information about the semiconductor integrated circuit; scans the measurement areas on the routing layout pattern produced by an automatic placement and routing tool; checks whether the wiring density of each wiring layer is less than the upper limit value of the wiring density; and replaces each wide wire by a plurality of narrow wires formed by dividing the wire when the wiring density exceeds the upper limit value so that the sum total of the widths of the divided wires becomes equal to the width of the wire before the division. This can make the current flowing through the wiring set after the correction equal to the current flowing through the wire before the correction, which makes it easier to control the consumption power in the semiconductor integrated circuit design. Furthermore, since the present embodiment 6 can automatically correct the routing layout pattern such that the wiring density becomes less than the upper limit value, the efficiency of the routing design can be improved. Moreover, the reliability is improved of the semiconductor integrated circuit obtained by the automatic placement and routing method or by the automatic placement and routing apparatus.

Embodiment 7

Figure 16:
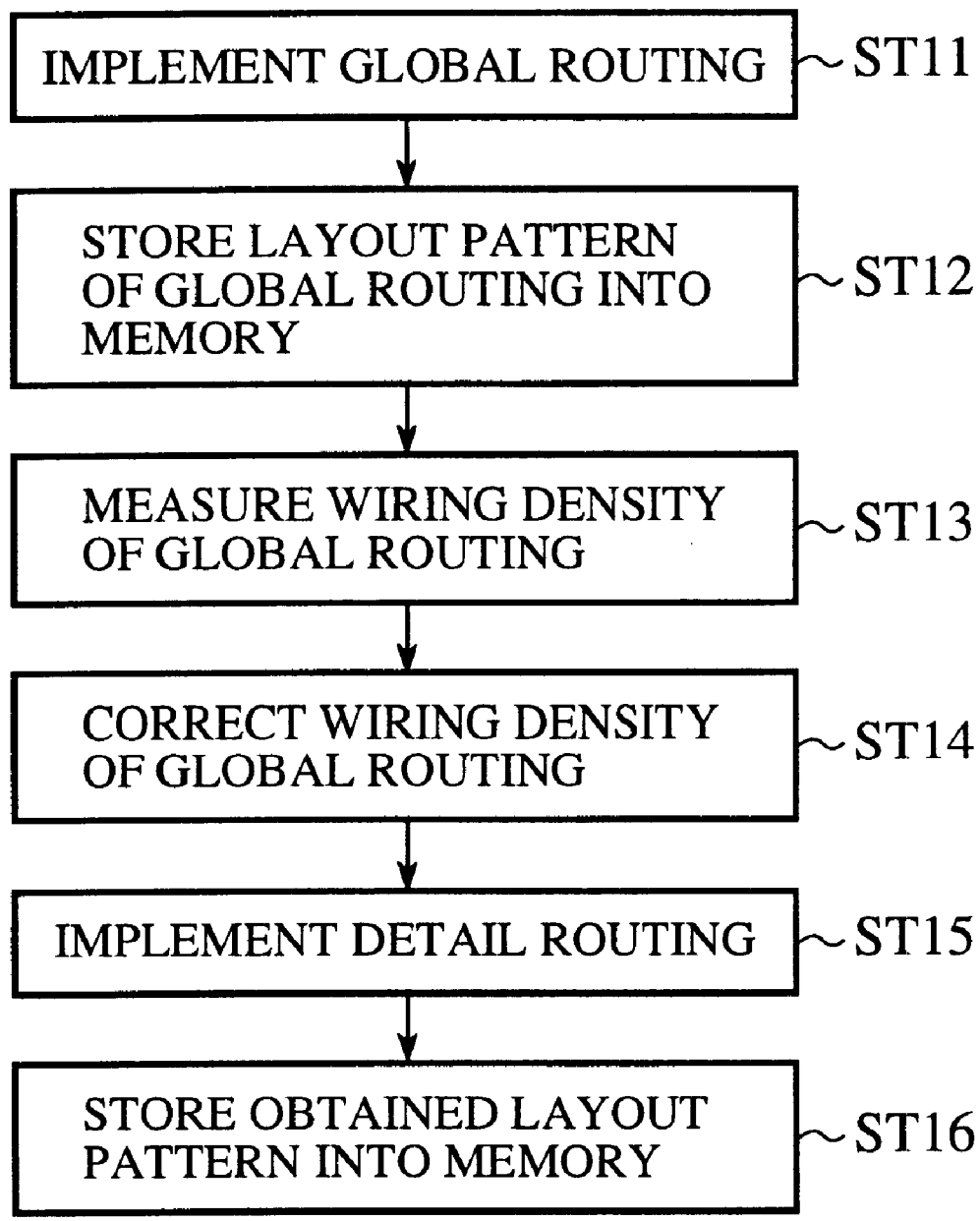
FIG. 16 is a flowchart illustrating the operation of the automatic placement and routing method in an embodiment 7 in accordance with the present invention.

FIG. 16 is a flowchart illustrating the operation of the automatic placement and routing method of an embodiment 7 in accordance with the present invention 7. The automatic placement and routing method of the present embodiment 7 is applicable to the routing layout patterns as shown in FIGS. 2–15 described in connection with the foregoing embodiments 1–6.

Next, the operation of the present embodiment 7 will be described.

The automatic placement and routing method of the present embodiment 7 is supplied with gate level circuit information about a semiconductor integrated circuit obtained in accordance with the specification of the function and structure of the semiconductor integrated circuit described in the hardware description language HDL, followed by carrying out global routing with an automatic placement and routing tool, and then by generating a layout pattern from the global routing (step ST11).

In the global routing, a global routing layout pattern is generated by estimating the number of wires that can be placed in a prescribed area such as 5 tracks by 5 tracks, and by determining routing.

Subsequently, the global routing layout pattern is stored in a memory not shown (step ST12), followed by measuring the wiring density of the global routing layout pattern. The measuring method is the same as that of the embodiment 1. Specifically, a check is made as to whether the wiring density of each wiring layer is less than the upper limit value of the wiring density by scanning the measurement area. In addition, the check is carried out on a plurality of measurement areas with shifting the measurement area 105 on the semiconductor integrated circuit in the same manner as described in connection with the embodiment 1 (step ST13).

If it is found that the wiring density exceeds the upper limit value as a result of the measurement at step ST13, the routing is corrected so that the new routing layout pattern has a wiring density less than the upper limit value, or replaced with a plurality of divided wiring set (step ST14). To achieve the correction, the methods as described in the embodiments 1–6 are applied. In this way, a global routing layout pattern, the wiring density of which is less than the upper limit value, is obtained.

Subsequently, detail routing is performed for the global routing layout pattern whose wiring density is less than the upper limit value. The detail routing is to perform the entire routing for the layout pattern of the semiconductor integrated circuit (step ST15). Then, the layout pattern of the detail routing of the semiconductor integrated circuit is stored in the memory not shown (step ST16).

As described above, the present embodiment 7 is configured such that it performs the global routing in accordance with the gate level circuit information; scans the measurement area on the global routing layout pattern; checks whether the wiring density of the global routing layout pattern is less than the upper limit value of the wiring density; corrects the layout pattern when the wiring density exceeds the upper limit value so that the wiring density becomes less than the upper limit value; and carries out the detail routing for the corrected global routing layout pattern. This makes it possible to facilitate generating the global routing layout pattern whose wiring density is less than the upper limit value, and to reduce the time taken to carry out rerouting because the entire routing is performed thereafter, thereby improving the efficiency of the routing design. Furthermore, the reliability of the semiconductor integrated circuit obtained by the automatic placement and routing method can also be improved.

What is claimed is:

1. An automatic placement and routing method of automatically controlling the wiring density, said automatic placement and routing method comprising the steps of;

generating a routing layout pattern from gate level circuit information about a semiconductor integrated circuit by using an automatic placement and routing tool;

scanning a predetermined measurement area in the routing layout pattern;

checking whether a wiring density in the measurement area is less than a predetermined upper limit value or not as a result the scanning; and correcting, if the wiring density exceeds the upper limit value, the routing layout pattern such that the wiring density becomes less than the upper limit value.

2. The automatic placement and routing method according to claim 1, further comprising the step of generating a routing layout pattern with a wiring density less than the upper limit value.

3. The automatic placement and routing method according to claim 1, wherein the routing layout pattern is a global routing layout pattern, and wherein said automatic placement and routing method further comprises the step of generating a detail routing layout pattern of the semiconductor integrated circuit from the corrected global routing layout pattern.

4. The automatic placement and routing method according to claim 1, wherein when it is found that the wiring density in a same layer exceeds the upper limit value as a result of the step of checking, the step of correcting the routing layout pattern carries out the correction by extending wiring spacing to make the wiring density less than the upper limit value, the extension of the wiring spacing is made by one of extending the wiring spacing at a predetermined value, extending the wiring spacing at a predetermined ratio, and extending the wiring spacing by a minimum value that makes the wiring density less than the upper limit value.

5. The automatic placement and routing method according to claim 1, wherein when it is found that the wiring density in a same layer exceeds the upper limit value as a result of the step of checking, the step of correcting the routing layout pattern carries out the correction by inserting a wiring inhibited region of a predetermined width between wires to make the wiring density less than the upper limit value.

6. The automatic placement and routing method according to claim 1, wherein when it is found that the wiring density in a same layer exceeds the upper limit value as a result of the step of checking, the step of correcting the routing layout pattern carries out the correction by forming part of the wiring on a different layer through contact holes to make the wiring density less than the upper limit value.

7. The automatic placement and routing method according to claim 1, wherein when it is found that the wiring density in a same layer exceeds the upper limit value as a result of the step of checking, and that the wiring density cannot be reduced by shifting a wide wire with a width greater than a predetermined value, the step of correcting the routing layout pattern carries out the correction by dividing the wide wire into a plurality of narrower wires and by replacing the wide wire by the narrower wires to make the wiring density less than the upper limit value.

8. The automatic placement and routing method according to claim 7, wherein when it is found that the wiring density of wires formed on a same layer exceeds the upper limit value, and hence the wide wire is to be replaced by the plurality of narrow wires, the step of correcting the routing layout pattern carries out the correction by making the width from one side to the other side of the plurality of narrow wires equal to or less than the width of the wide wire.

9. The automatic placement and routing method according to claim 7, wherein when it is found that the wiring density of wires formed on a same layer exceeds the upper limit value, and hence the wide wire is to be replaced by the plurality of narrow wires, the step of correcting the routing layout pattern carries out the correction by making a sum total of widths of the plurality of narrow wires equal to the width of the wide wire.

10. A semiconductor integrated circuit produced by applying an automatic placement and routing method of automatically controlling the wiring density, said automatic placement and routing method comprising the steps of:

generating a routing layout pattern from gate level circuit information about a semiconductor integrated circuit by using an automatic placement and routing tool;

scanning a predetermined measurement area in the routing layout pattern;

checking whether a wiring density in the measurement area is less than a predetermined upper limit value or not as a result of the scanning; and .

correcting, if the wiring density exceeds the upper limit value, the routing layout pattern such that the wiring density becomes less than the upper limit value.

11. An automatic placement and routing apparatus for automatically controlling a wiring density, said automatic placement and routing apparatus comprising:

means for generating a routing layout pattern by retrieving gate level circuit information about a semiconductor integrated circuit stored in a memory and by using an automatic placement and routing tool;

means for scanning a predetermined measurement area in the routing layout pattern;

means for checking whether a wiring density in the measurement area is less than a predetermined upper limit value or not as a result of the scanning;

means for correcting, if the wiring density exceeds the upper limit value, the routing layout pattern such that the wiring density becomes less than the upper limit value by dividing a wire into a wiring set consisting of a plurality of wires; and means for generating the routing layout pattern with the wiring density less than the upper limit value.

12. The automatic placement and routing apparatus according to claim 11, wherein said means for correcting the routing layout pattern divides the wire such that a width of the wiring set from one side to the other side is equal to or less than a width of the wire before division.

13. The automatic placement and routing apparatus according to claim 11, wherein said means for correcting the routing layout pattern divides the wire such that a sum total of widths of individual wires of the wiring set after the division is equal to the width of the wire before the division.

* * * * *